United States Patent
Böhm

(10) Patent No.: US 6,275,383 B1
(45) Date of Patent: Aug. 14, 2001

(54) DEVICE FOR THE STORAGE OF MEMORY CARDS

(76) Inventor: Erich Böhm, Erich Böhm Irrenloher Damm 17, 92521 Schwarzenfeld (DE)

( * ) Notice: Subject to any disclaimer, the term of this patent is extended or adjusted under 35 U.S.C. 154(b) by 0 days.

(21) Appl. No.: 09/363,097

(22) Filed: Jul. 29, 1999

(30) Foreign Application Priority Data

Aug. 8, 1998 (DE) .............................................. 198 35 961

(51) Int. Cl.[7] .............................. H05K 7/14; H05K 7/18
(52) U.S. Cl. ....................... 361/752; 439/630; 439/945; 361/756; 361/801; 361/802
(58) Field of Search .................... 361/752, 737, 361/736, 801, 756, 759, 802, 807; 439/945, 946, 836; 211/41.17; 220/4.02; 206/701, 706

(56) References Cited

U.S. PATENT DOCUMENTS

| | | |
|---|---|---|
| 4,852,727 | 8/1989 | Oberle . |
| 5,478,260 * | 12/1995 | Kaufman et al. ................ 439/609 |
| 5,928,016 * | 7/1999 | Anderson et al. ................ 439/159 |
| 5,933,328 * | 8/1999 | Wallace et al. .................. 361/737 |
| 6,050,848 * | 4/2000 | Yao .................................. 439/483 |
| 6,068,500 * | 5/2000 | Kantner ............................ 439/218 |
| 6,089,911 * | 7/2000 | Goto et al. ....................... 439/571 |
| 6,102,743 * | 8/2000 | Haffenden et al. .............. 439/630 |

FOREIGN PATENT DOCUMENTS

| | | |
|---|---|---|
| 8632367 | 3/1986 | (DE) . |
| 195 47 254 | 6/1997 | (DE) . |
| 29708189 | 8/1997 | (DE) . |
| 286713B1 | 10/1988 | (EP) . |

OTHER PUBLICATIONS

German Serach Report, German Application No. 198 35 961.6, dated Mar. 17, 1999.

* cited by examiner

Primary Examiner—Jayprakash N. Gandhi
Assistant Examiner—Hung Bui
(74) Attorney, Agent, or Firm—Dority & Manning, P.A.

(57) ABSTRACT

A device for storing electronic data storage cards has a rim member defining one storage compartment. The compartment has an insertion side with a configuration such that a storage card is slidable into the compartment. A plurality of holding guides are disposed around and define a portion of the circumference of the compartment. The holding guides have structure that engages against edges of the storage card to align and position the card within the compartment.

17 Claims, 2 Drawing Sheets

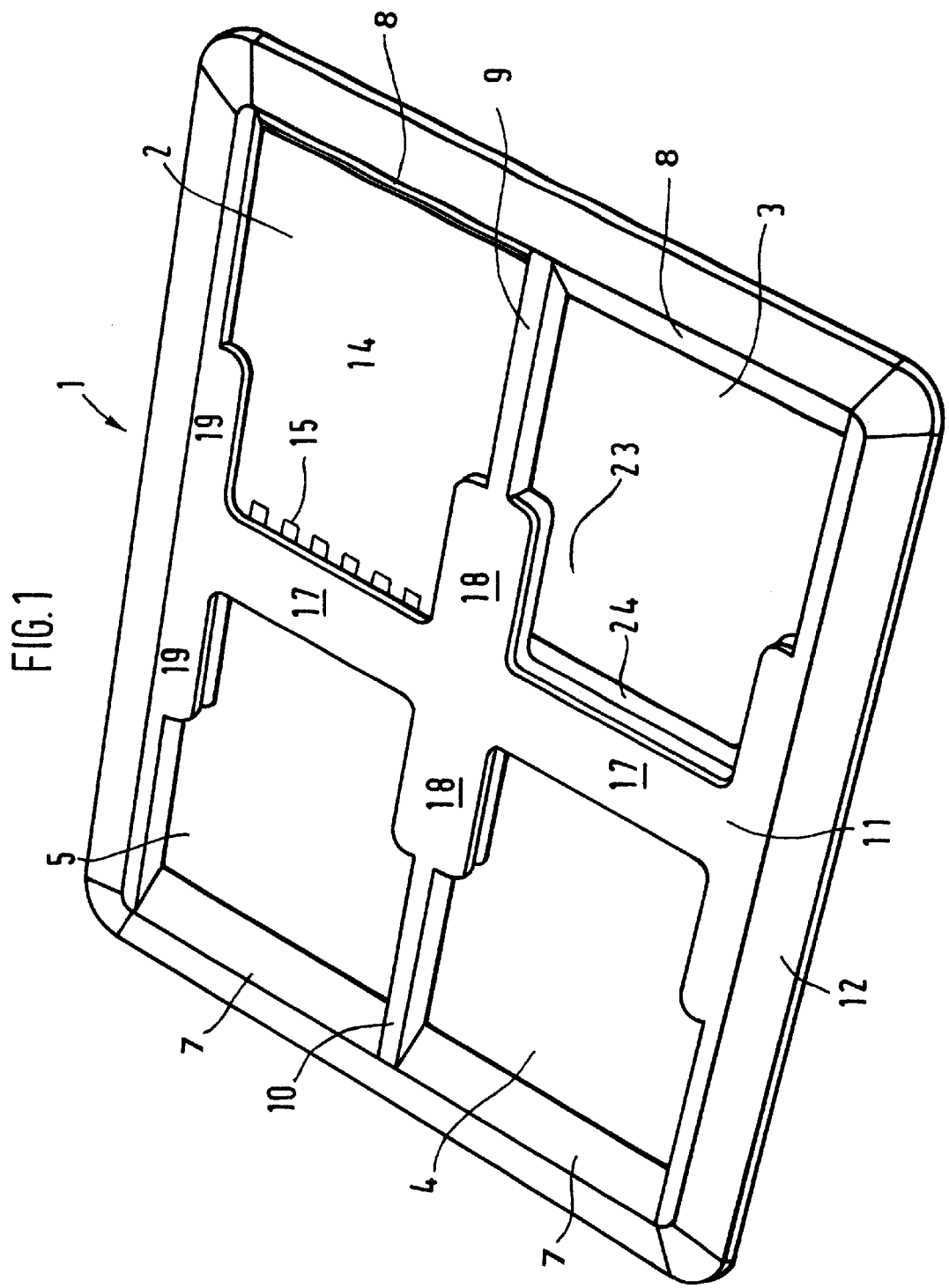

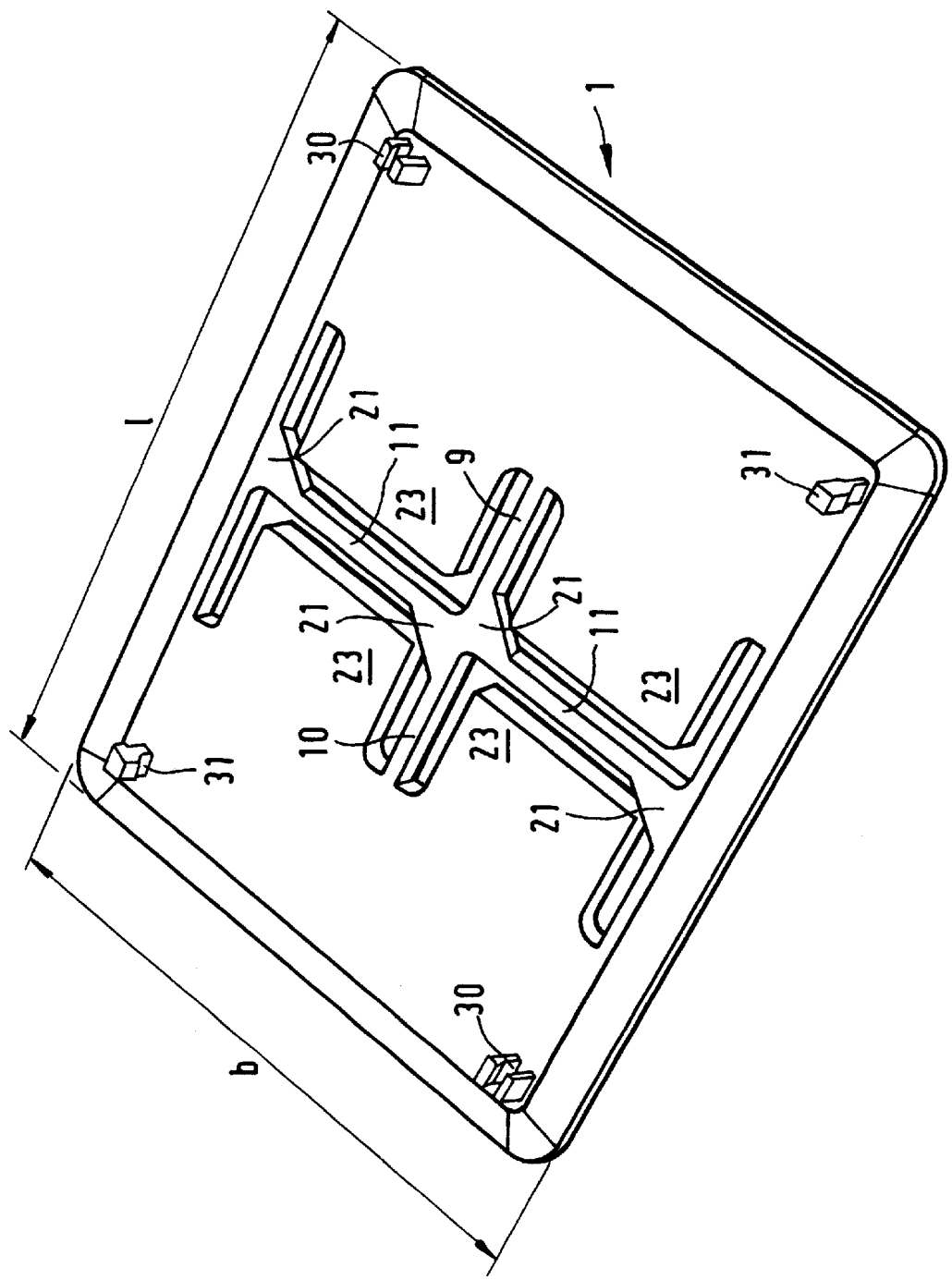

DEVICE FOR THE STORAGE OF MEMORY CARDS

BACKGROUND

The present invention concerns a device for the storage of memory cards.

It is already in common knowledge that so-called multimedia cards are employed as storage media, for instance, for audio-players. These memory cards exhibit electronic storage characteristics of a high degree of density. Because of their small size and their light weight, these cards adapt themselves for use in audio-players very well. Beyond this, every user of a player generally owns so many cards, upon which music is stored, that the said user is allowed insufficient means of indexing the same. The small size of the memory cards contributes to the difficulty of safely transporting them. Besides this, there is a substantial danger of damaging the memory cards during the transport, or in the storage of the cards outside of the audio player.

SUMMARY OF THE INVENTION

A principal purpose of the invention is, accordingly, to make possible a safe transport and good storage facility for the memory cards outside of the apparatuses which use the said memory cards. A further purpose is to achieve an easy visual review of contents of a plurality of stored memory cards. Additional objects and advantages of the invention will be set forth in part in the following description, or may be obvious from the description, or may be learned through practice of the invention.

The purposes will be attained by a device for the storage of memory cards, in particular multi-media cards, whereby guides are provided for the insertion of at least one, advantageously several, memory card(s) into the said device. The guides, to accomplish this purpose, may be oblong in shape and contact the cards only on their outer edges. The guides further might be, for instance, designed as a kind of nub and penetrate into corresponding depressions in the memory card, or in the memory card edges. The invented manner of construction succeeds, by an advantageous design, in combining several memory cards together in one storage unit. This eases the transport thereof and provides to the user an easy and quick review over all of the assembled memory cards. The device serves thus as a card holder and a protective means for both transport and safe storage for such memory cards.

So that the memory cards do not undesirably fall free from the device during transport, the device exhibits retaining means for the memory cards. The retaining means can be brought about by protuberances or nubs, which the device possesses and which penetrate into recesses of the memory cards, which recesses are in both function and shape, complementary to the said protuberances. The retaining means also can be so designed that the memory cards can be taken into one of the recesses only by suffering a slight change of shape, which change, however, is not so large so that the characteristics of the memory card are not damaged upon insertion nor upon withdrawal from said recess. The total effect is, however, that of themselves, the memory cards cannot work themselves out of the retaining means.

It is further advantageous if the device exhibits insertion side openings for the memory cards, these being advantageously formed by top flanging the said guides themselves. By means of the sliding in of the memory cards into the appropriate slot, an easy and quick loading of the device is brought about as well as making possible an advantageous withdrawal of said cards.

In a development of the apparatus, insertion precautions for the memory cards have been provided. "Insertion precautions" are to be understood in the concept of the invented device, as a means which enable the memory cards to be inserted in only one way so as to take only a single, unique position within the storage device. These precautions are to prevent, that the memory cards in relation to their storage, assume differing orientation and position. Such insertion precautions take care, that the memory cards align themselves in a particular, specific position in the invented storage device. This can be accomplished in that the memory cards are so designed asymmetrically, that they, coacting with the said precautionary measures, assume only one unique position in the storage device. Advantageously, in one embodiment of the invention, the precautionary measures can be so designed as to serve in their function simultaneously also the function of secure retention means.

For the protection of the electrical contacts of the memory cards, it is preferable if the device exhibits protective measures for this purpose. These protective measures can be a complete or a partial covering of the electrical contacts by the invented device.

By these protective means, the electrical contacts, as is their memory card, are shielded from harmful mechanical or external action. The protective measures can also possess the characteristics and functions of the insertion and retaining operations.

In an advantageous embodiment of the invention, the card storage device exhibits connection elements, in order to make possible additive combinations with other like devices. In this way, the single device can be consolidated into a greater, unified storage unit. This increases the viewing of the content of a plurality of stored memory cards stored in accord with the invention and increases the application possibilities of the equipment. Moreover, this makes the devices easier to transport. In all, these enumerated characteristics provide a higher degree of application for the user.

In particular, advantage lies therein in that the invented device possesses the width and length of a credit card. Because of this shaping of the device, it can be inserted in many known device storage means, including, for example, Filofax. The small shape of the invented device brings about the achievement, that it can be transported in briefcases, manuals, or luggage, so that for the invented storage device, existing spaces in the said transport means can be used. This again increases the application possibilities of the invented device.

In order to protect the memory cards from dirt and contamination, the said device possesses advantageously a protecting casing, that is, a housing or a box. Because of the design of a closed sheathing of this type of the memory card storage device, the memory cards cannot only be protected from dirt, but also from the action of electromagnetic radiation, in particular, light.

In an additional advantageous embodiment, the invented device is designed as a one-piece unit. By this means, it becomes possible to economically fabricate the said device, since for such fabrication, only a simple manufacturing operation is required. In a favorable form of the invention, it is possible, with only one machine, to make an entire memory card storage device by injection molding. The memory card holder is thereby economical in its manufacture.

A spring and a pressure applicator affixed thereon enables a particularly firm and sure retention of the memory card.

This arrangement presses the memory cards against the widening or top flange of the guide, i.e. a slot, between flange and spring surface.

If the memory card is snapped into the memory card storage device, by, for instance, nubs aligned along the sides, a retention means and a guide for the memory card can be created. The edge located nubs, which overlap the memory cards in several places, so act that the memory card is reliably retained. The memory card can be withdrawn from the nubs, since either the invented storage device exhibits an opening, through which the holding power of snapping clips can be released from the memory cards by pressing, or the invented device can possess a trough like opening, with which the memory card can be extracted from the snap device. The nubs can grip either along the sides of the memory cards or, in case of a memory card possesses a penetrating opening, particularly a circular hole, the snap-guide can retain the memory card by circumferentially protruding through this circular opening in the same manner as along the sides.

The invention will be more closely described with the aid of reference to the drawings.

BRIEF DESCRIPTION OF THE DRAWINGS

FIG. 1 a perspective top view of an invented memory card holder,

FIG. 2 a perspective underside view of said memory card holder.

DETAILED DESCRIPTION

Reference will now be made in detail to the presently claimed invention, one or more examples of which are illustrated in the drawings. Each example is provided by way of explanation of the present invention, and not as a limitation of the invention. For example, features illustrated or described as part of one embodiment may be used with another embodiment to yield still a different embodiment. It is intended that the present invention include such modifications and variations.

In FIG. 1, is shown a device for the storage of memory cards 14, seen in an inclined, perspective view. The memory card holding device 1 possesses an essentially rectangular shape with an encompassing rim 12, which is chamfered toward the outside. By this chamfering design on the outer border of the rim 12, a lessening of thickness is achieved, which eases the insertion of the device into a storage container.

The device 1 exhibits further, four insertion compartments 2, 3, 4, 5 for the memory cards 14. These insertion compartments are axially symmetrically aligned to the device 1. Each insertion compartment has, along the sides proximal to the said rim, slanted sides 7. These slanted sides 7, make more convenient the insertion and withdrawal of a memory card 14 in and out of the respective insertion slot 2, 3, 4 and 5.

The insertion compartments 2, 3, 4, 5 are separated from one another by longitudinal tie-bars 9 and 10 and a transverse tie-bar 11. The tie-bar 11 exhibits widening portions 17, which increase its rigidity. Widening portions 18 are also designed in the transition of the transverse tie-bar 11 to the longitudinal tie-bars 9 and 10. Widening portions 19 are designed along the peripheral rim 12 at the transition of tie-bar 11. The widening portions 17, 18, 19 so act that they retain the memory cards 14 in the insertion compartments against undesirable falling out, since they overlap edgewise the memory cards 14. A further usage of the widenings, especially the widening 17, lies therein, in that the electrical contacts 15 of the memory cards 14 are protected against contamination and mechanical damage, when said cards are in the inserted condition and contacts overlapped by the widening 17.

The tie-bars 9, 10 as well as the widening 17, 18, 19 form, of themselves, in the present embodiment, the guidance for the reception of the memory cards 14. By the chamfering 8, the memory card 14, coacting with the widenings 18, 19 is slightly bowed, so that a firm stress of said card is engendered by the storage device 1. The distortion of the memory card 14 must be very slight, so that in any case there is assurance, that said memory card 14 is not damaged.

By means of the chamfers 8, it becomes possible, in a very simple way to remove the memory card 14 from the holding means, by sliding in the longitudinal direction. The chamfers 8 act in this way as a ramp, which lets the memory card slide out of the guides. In another embodiment, the chamfers 8 could be substituted for with an essentially vertical (with respect to the axes) edge similar to the lateral guides 12, 9, 10. In this case the underside of the device 1 exhibits an opening in the respective compartment, with which, for instance, the memory card 14 is lifted out with finger pressure and with a subsequent lateral sliding, the said memory card 14 is removed from the said compartment.

In another not shown embodiment, the guides in the individual compartments can be so designed that the memory cards 14 are snapped into their respective compartments. In this case, widenings in the manner of widenings 17, 18 and 19 as seen in the embodiment of FIG. 1 can find application in which only a very small overlapping of the memory card 14 takes place. Here, it is possible to overcome the small overlaps by a slight deformation of the memory cards 14, so that the memory cards 14 are, when stored, retained by a recess underneath the peripheral extensions.

If the memory cards 14 exhibit openings, then the possibility arises that in the memory card storage device 1, springlike clips can be inset during injection molding to effect fixing the memory cards 14 in the said device 1.

The widenings 17, 18 and/or 19, or the chamfered rims, 12 can be provided for labeling the therein contained memory card 14. This can be done by means of direct inscribing or by means of prepared surfaces for the affixing of labels.

In order to assure that the fastening of the memory card in its respective compartment is secure, a spring device 23, with a pressure applying edge 24 is provided. The pressure edge 24 is designed to project above the base surface of the respective compartments 2, 3, 4, 5. By means of this spring 23, arises a pressure force of the inserted memory card 14 against the flange-like widenings 17, 18, and 19. The holding security of the memory card 14 in the memory card storage device 1 is increased by the said spring 23 and its attendant edge 24. Besides this, a bending of the memory card 14 is not necessary, or only slightly necessary, since the bottom surface of the insertion compartment 2, 3, 4, 5, because of its design as a spring, is resilient thus permitting the insertion and removal of the memory card.

In FIG. 2 an underside view of a memory card storage device 1 is presented. In this drawing, the spring-like design of the individual insertion compartments 2, 3, 4, 5 is clear. As already explained above, first, the secure fixing of the memory card 14 in its respective compartment is possible.

Second, this makes possible, in a simple manner, the manufacture of the widenings 17, 18 and 19, since the tool reaches from the underside of the device 1 to the underside of the widenings 17, 18 and 19. Thus, on the one hand, the spring 23 and on the other hand, simultaneously the widening 17, 18 and 19 are created.

Insertion security means 21 so act that the respective compartment, in relation to the memory card, is made asymmetric. Thereby, assurance is given that the memory card 14 will always be inserted in a specified alignment in the insertion compartment 2, 3, 4, 5 and thus the electrical contacts enter the protected position.

The device 1 for the storage of memory cards can possess corresponding connection elements 30 and 31, which permit a second and like device 1 to be combined with the first. Connection elements 30, 31 of this kind can be placed on each side of the memory card 14 storage device 1, so that a plurality of identical storage devices 1 can be connected to one another. By the combination of several devices 1, arises simultaneously a double protection of the memory cards 14, which are stored in different storage devices 1. These form together a protective sheathing for neighboring memory cards 14. Obviously, at all events, individual protective enclosures could be foreseen, which could contribute to the protection of one memory card 14 storage device 1.

obviously too, the object of the invention in the advantageous dimensions of a credit card can be made available in other dimensions, such as length 85 mm and a width of about 54 mm.

If the width and the length of the device 1 somewhat coincides with the dimensions of a credit card, then the device 1 can also be used for the storing of credit cards, for example, placed in briefcases. Such an application would be favorable by the thinner rim 12.

Such devices 1 can be used for a memory card 14, wherein the unused surface available on the said device could be used for printed information regarding the content of the memory cards or for advertising.

In a further, not shown embodiment, the devices 1 themselves are arranged similarly to the arrangement of transparent photos in diamagazine type holder. In this application, an advantageous retention in the storage device and its corresponding surfaces can be achieved, which prevents the falling out of the devices 1 from the said storage magazine.

As already described above, besides the presented guiding and retention means for the memory cards, also a snap apparatus can be provided, in which the memory cards are snapped in. The snaps, which can be in the form of nubs, can grip the memory cards either on the sides or through openings, which openings are provided in the memory card. A release of the memory card from these clip guides can by achieved, in that the finger can grasp under the memory cards and then these are released from the said nubs. Further, in the device 1, openings may be made available, through which, by means of a finger pressure, the memory card is pushed out of the clip retainers. Likewise, it is possible, and falls under the protective realm of the invention, that by means of a bending of the invented device 1, the memory cards are moved out of the guide retainment or can be easily lifted away.

It should be apparent to those skilled in the art that various modifications and variations can be made in the invention without departing from the scope and spirit of the invention. It is intended that the present invention include such modifications and variations as come within the scope of the appended claims and their equivalents.

Claimed is:

1. A device for storing electronic data storage cards, including multi-media cards, said device comprising:
   a rim member defining at least one storage compartment, said compartment having an insertion side with a configuration such that a storage card is slidable therepast into said compartment;
   a plurality of holding guides disposed around and defining at least a portion of a circumference of said compartment, said holding guides comprising structure that engages against edges of the storage card to align and position the card within said compartment; and
   wherein at least one of said holding guides further comprises retaining structure that overlaps and engages at least one edge of the card inserted in said compartment to prevent the card from falling out of said compartment and wherein the rim member and the at least one holding guide act against the card to slightly deform the card and hence retain the card in the device.

2. The storage device as in claim 1, wherein said holding guides define a slip-in configuration for said compartment wherein edges of the card is slid along said holding guides into said compartment.

3. The device as in claim 1, wherein at least one of said holding guides comprises a transverse bar member extending between opposite sides of said rim member.

4. The device as in claim 3, wherein said transverse bar member is disposed at a forward side of said compartment, said transverse bar member has a widening portion that overlaps the forward edge of the storage card.

5. The device as in claim 4, further comprising a longitudinal tie-bar member extending between second opposite sides of said rim member generally perpendicular to said transverse bar member, said longitudinal tie-bar member further comprising a widening portion that overlaps a longitudinal edge of the storage card.

6. The device as in claim 4, wherein said widening portion has a width so as to extend at least partially over electrical contacts on the forward edge of the storage card.

7. The device as in claim 1, further comprising a plurality of said compartments wherein at least one said compartment is disposed on opposite sides of a transverse bar member extending between first opposite sides of said rim member and common to forward sides of said compartments.

8. The device as in claim 7, wherein said transverse bar member comprises a widening portion that extends beyond said forward sides of said compartments so as to overlap forward edges of storage cards inserted into said compartments.

9. The device as in claim 8, further comprising a longitudinal tie-bar member extending between second opposite sides of said rim member and generally perpendicular to said transverse tie-bar member, said longitudinal tie-bar member having a widening portion that extends beyond a longitudinal side of said compartments so as to overlap a longitudinal side of storage cards inserted into said compartments.

10. The device as in claim 9, wherein said rim member further comprises a widening portion that extends beyond an opposite longitudinal side of said compartments so as to overlap an opposite longitudinal side of the storage cards inserted into said compartments.

11. The device as in claim 1, further comprising an insertion security member configured with said compartment so that a storage card is only insertable into said compartment at a proper orientation thereof.

12. The device as in claim 1, further comprising connection elements on said rim member for interconnecting a plurality of said devices in a stacked configuration.

13. The device as in claim 1, wherein said device is a unitary formed piece.

14. The device as in claim 1, further comprising a spring member disposed so as to engage and hold a storage card within said compartment.

15. The device as in claim 14, wherein said spring member comprises a resilient bottom surface of said compartment.

16. The device as in claim 15, wherein said resilient bottom surface further comprises an upstanding element configured to press against a bottom surface of a storage card inserted into said compartment.

17. The device as in claim 16, wherein said upstanding element comprises an edge member extending generally perpendicular from said bottom surface.

* * * * *